United States Patent
Beaman et al.

[11] Patent Number: 6,104,201
[45] Date of Patent: Aug. 15, 2000

[54] METHOD AND APPARATUS FOR PASSIVE CHARACTERIZATION OF SEMICONDUCTOR SUBSTRATES SUBJECTED TO HIGH ENERGY (MEV) ION IMPLEMENTATION USING HIGH-INJECTION SURFACE PHOTOVOLTAGE

[75] Inventors: Brian Samuel Beaman, Apex, N.C.; Keith Edward Fogel, Mohegan Lake, N.Y.; Paul Alfred Lauro, Nanuet, N.Y.; Maurice Heathcote Norcott, Fishkill, N.Y.; Da-Yuan Shih, Poughkeepsie, N.Y.; George Frederick Walker, New York, N.Y.

[73] Assignee: International Business Machines Corporation, Armonk, N.Y.

[21] Appl. No.: 09/162,474

[22] Filed: Sep. 28, 1998

Related U.S. Application Data

[62] Division of application No. 08/744,903, Nov. 8, 1996, Pat. No. 5,838,160.

[51] Int. Cl.[7] .................................................... G01R 31/02
[52] U.S. Cl. ............................................. 324/755; 324/754
[58] Field of Search .................................... 324/754, 755, 324/757, 761, 765

[56] References Cited

U.S. PATENT DOCUMENTS

| 4,955,523 | 9/1990 | Calomagno et al. | 228/180.5 |
| 5,476,211 | 12/1995 | Khandros | 228/180.5 |
| 5,852,871 | 12/1998 | Khandros | 29/843 |

OTHER PUBLICATIONS

Moto'o Nakano, A Probe for Testing Semiconductor Integrated Circuits and a Test Method Using Said Probe, J–Tech Translations, Disclosure No.: Hei 3–69131, Mar. 25, 1991, pp. 1–10.

*Primary Examiner*—Josie A. Ballato
*Assistant Examiner*—Russell M Kobert
*Attorney, Agent, or Firm*—Thomas A. Beck

[57] ABSTRACT

Probe structures for testing electrical interconnections to integrated circuit devices and other electronic components; particularly to testing integrated circuits devices with high density area array solder ball interconnections. The probe structure is formed from a substrated have a surface, with at least one electrical contact location having a perimeter which is raised above the surface, and a location within the boundaries of said perimeter which is raised above the surface.

10 Claims, 5 Drawing Sheets

METHOD AND APPARATUS FOR PASSIVE CHARACTERIZATION OF SEMICONDUCTOR SUBSTRATES SUBJECTED TO HIGH ENERGY (MEV) ION IMPLEMENTATION USING HIGH-INJECTION SURFACE PHOTOVOLTAGE

This is a divisional, continuation-in-part of application Ser. No. 08/744,903, filed Nov. 8, 1996, now U.S. Pat. No. 5,838,160.

CROSS REFERENCE TO A RELATED APPLICATION

U.S. patent application Ser. No. 08/055,485, now U.S. Pat. No 5,635,846, filed Apr. 30, 1993 to Beaman et al. describes a high density test probe for integrated circuit devices. The probe structure described in this application uses short metal wires that are bonded on one end to the fan out wiring on a rigid substrate. The wires are encased in a compliant polymer material to allow the probes to compress under pressure against the integrated circuit device. The wire probes must be sufficiently long and formed at an angle to prevent permanent deformation during compression against the integrated circuit device. High temperature applications of this type of probe are limited due to the glass transition temperature of the polymer material surrounding the probes as well as the coefficient of thermal expansion mismatch between the compliant polymer material and the rigid substrate.

FIELD OF THE INVENTION

The present invention is directed to probe structures for testing of electrical interconnections to integrated circuit devices and other electronic components and particularly to testing integrated circuit devices with high density are array solder ball interconnections.

BACKGROUND OF THE INVENTION

Integrated circuit (IC) devices and other electronic components are normally tested to verify the electrical function of the device and certain devices require high temperature burn-in testing to accelerate early life failures of these devices. The interconnection methods used to test these devices include permanent, semi-permanent, and techniques. The permanent and semi-permanent techniques that are typically used include soldering and wire bonding to provide a connection from the IC device to a substrate with fan out wiring or a metal lead frame package. The techniques include rigid and flexible probes that are used to connect the IC device to a substrate with fan out wiring or directly to the test equipment.

The permanent attachment techniques used for testing integrated circuit devices such as wire bonding to a lead-frame of a plastic leaded chip carrier are typically used for devices that have low number of interconnections and the plastic leaded chip carrier package is relatively inexpensive. The device is tested through the wire bonds and leads of the plastic leaded chip carrier and plugged into a test socket. If the integrated circuit device is defective, the device and the plastic leaded chip carrier are discarded. The semi-permanent attachment techniques used for testing integrate circuit devices such as solder ball attachment to a ceramic or plastic pin grid array package are typically used for devices that have high number of interconnections and the pin grid array package is relatively expensive. The device is tested through the solder balls and the internal fan out wiring and pins of the pin grid array package that is plugged into a test socket. If the integrated circuit device is defective, the device can be removed from the pin grid array package by heating the solder balls to their melting point. The processing cost of heating and removing the chip is offset by the cost saving of reusing the pin grid array.

The most cost effective techniques for testing and burn-in of integrated circuit devices provide a direct interconnection between the pads on the device to a probe sockets that is hard wired to the test equipment. Contemporary probes for testing integrated circuits are expensive to fabricate and are easily damaged. The individual probes are typically attached to ring shaped printed circuit board and support cantilevered metal wires extending towards the center of the opening in the circuit board. Each probe wire must be aligned to a contact location on the integrated circuit device to be tested. The probe wires are generally fragile and easily deformed or damaged. This type of probe fixture is typically used for testing integrated circuit devices that have contact along the perimeter of the device. This type of probe cannot be used for testing integrated circuit devices that have high density are array contacts.

The prior art described below includes variety of different probe fixtures for bare testing IC chips. Although most of these probe fixtures use rigid protrusions to form the contact, only a few include a cup shaped geometry around the raised contact to contain the volume of the solder balls at high temperature. The Integral Rigid Test Probe is the only fixture that can be fabricated using an inexpensive epoxy glass laminate substrate with copper wiring and doesn't require additional proc essing steps for the IC chips to be tested. The ability to repair or replace and individual probe on the fixture is another unique feature to this approach.

U.S. Pat. No. 4,975,079 issued Dec. 4, 1990 to Beaman et al., is directed to fixtures for testing bare IC chips with solder balls on the I/O contacts at high temperatures for non-destructive burn-in. The fixture is manufactured on a multilayer ceramic substrate with an array of contact pads connected to the fanout wiring. An abrasive fabrication process is used to created raised probe contacts on the surface of the substrate. The raised probes are covered by a polymer material and cup shaped openings are ablated through the to expose the raised contacts. The inside of the cup shaped openings and the surface of the raised probes are covered with a conductive material. The geometry of the cup shaped opening and the surface of the raised probes are optimized to penetrate the solder balls attached to the IC chip contacts and contain the solder volume at high temperatures. The fabrication techniques used to create this probe fixture cannot be used to repair or replace individual probe contacts.

U.S. Pat No. 5,007,163 issued Apr. 16, 1991 to Pope et al., is directed to fixtures for testing bare IC chips with solder balls on the I/O contacts at high temperatures for non-destructive burn-in. The fixture is comprised of a fanout substrate that used liquid metal joints between the contacts on the surface of the substrate and the solder balls on the IC chip. The liquid metal is composed of two separate metals that form a cutectic mixture when joined together and the mixture is a liquid at room temperature. One of the metals is deposited on the contact pads of the fanout substrate and the other metal is deposited on the surface of the solder balls attached to the IC chip. This technique for testing IC chips requires additional processing steps for the IC chips to deposit the additional metal material to the solder balls on the IC chip before testing and to clean the cutectic metal mixture from the solder balls after testing is completed.

These additional processing steps add to the cost of the IC chip and increase the potential for contamination of the IC solder balls with the cutectic metal mixture if not cleaned thoroughly.

U.S. Pat. No 5,172,050, issued Dec. 15, 1992 to Swapp is directed to fixtures for testing bare IC chips with solder balls on the I/O contacts. The fixture is manufactures from a silicon wafer or other semiconductor substrate material. The probe contacts are fabricated in the top surface of the substrate using micromachining techniques. Each prove contact is formed by etching a cavity into the substrate with a cantilevered beam extending into the center of the cavity, The fabrication techniques used to create this probe fixture cannot be used to repair or replace individual probe contacts. The geometry of the prove cavities are not useful for containing the plastic creep of the solder balls at high temperature. The minimum spacing and density of the probe contacts is limited by the need to use the space between the contacts for fanout wiring and the diameter of the cavities must be larger than the diameter of the solder balls to allow the cantilever beam contacts to flex.

U.S. Pat. No. 5,177,439, issued Jan. 5, 1993 to Liu et al., is directed to fixtures for testing bare IC chips. The fixture is manufactured from a silicon wafer or other substrate that is compatible with semiconductor processing. The substrate is chemically etched to produce a plurality of protrusions to match the I/O pattern on the bare IC chip. The protrusions are coated with a conductive material and connected to discrete conductive fanout wiring paths to allow connection to and external test system. The geometry of the protrusions for this fixture would not be compatible for high temperature testing of IC chips with solder balls on the I/O contact. The preferred geometry for high temperature testing of IC chips with solder balls is a small protrusion with a surrounding cup to contain the solder volume. The substrate used for fabrication of this probe fixture is limited to semiconductor wafers which are relatively expensive. The Integral Rigid Test Probe can be fabricated on a variety of inexpensive substrate with the fanout wiring.

U.S. Pat. No 5,207,585, issued May 4, 1993 to Byrnes et al., describes a thin interface pellicle probe for testing integrated circuit devices with solder balls. The probe structure described in this patent used metal rivets that are formed on a thin layer of polymer material. The rivets provide the a raised contact on opposite sides of the thin polymer sheet. The metal rivets provide the interconnection between the integrated circuit device and the substrate with fan out wiring. The geometry of the metal rivets provides a means of limiting the penetration of the probe tip into the solder balls on the integrated circuit device. The probes are separate from the wiring on the substrate and must be aligned to the contact pads on the substrate and the solder balls on the integrated circuit device. The probes are fabricated using gray scale photolithography processes and a single probe cannot be replaced or repaired.

SUMMARY OF THE INVENTION

It is the object of the present invention to provide a probe for testing integrated circuit devices and other electronic components that use solder balls for the interconnection means.

Another object of the present invention is to provide a probe that is an integral part of the fan out wiring on the test substrate or other printed wiring means to minimize the contact resistance of the probe interface.

A further object of the present invention is to provide a probe with a cup shaped geometry to limit the penetration of the probe contact interface into the solder ball interconnect means on the integrated circuit devices.

An additional object of the present invention is to provide a probe with a cup shaped geometry to contain the high temperature creep of the solder ball interconnection means on the integrated circuit devices during burn-in testing.

Yet another object of the present invention is to provide a probe with a cup shaped geometry to facilitate in aligning the solder balls on the integrated circuit device to the probe contact.

Yet a further object of the present invention is to provide an array of probe contacts that can be reworked to repair an individual probe without replacing the entire array of contacts.

A broad aspect of the present invention is a probe structure formed form a substrate having a surface having at least one electrical contact location which has a perimeter which is raised above the surface and a location within the boundaries of said perimeter which is raised above the surface.

A more particular aspect of the present invention is a probe structure further including another substrate having at least one electrical contact location on a surface thereof which has an electrically conducting protuberance disposed thereon which is disposed in electrical contact with the location within the boundaries of the perimeter of the electrically conducting contact location.

BRIEF DESCRIPTION OF THE DRAWINGS

These and other objects, features, and advantages of the present invention will become apparent upon further consideration of the following detailed description of the invention when read in conjunction with the drawing figures, in which.

DETAILED DESCRIPTION OF THE INVENTION

Preferred Embodiment

Figure 1:
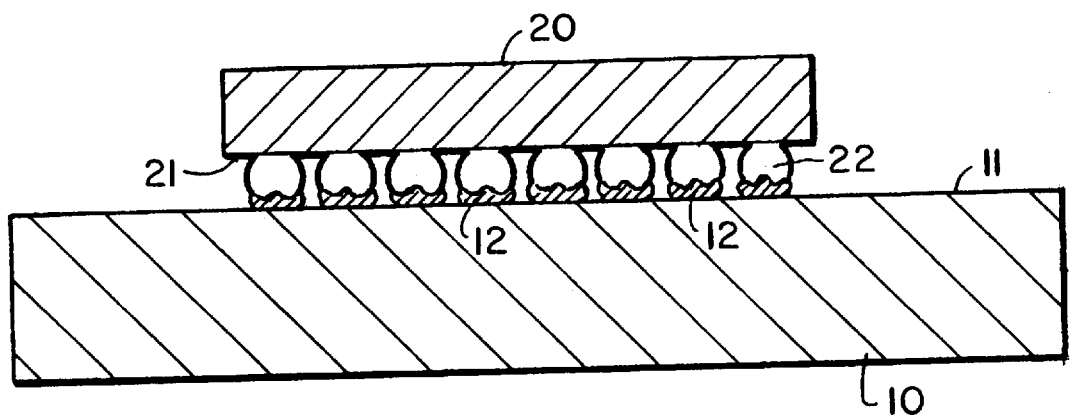
FIG. 1 shows a cross section of an integral rigid probe array attached to a substrate and pressed against the solder balls on an integrated circuit device.

FIG. 1 shows a cross section of a test substrate (10) and integral rigid test probe (12) according to the present invention. The test substrate (10) provides a rigid base for attachment of the probe structures (12) and fan out wiring from the high density array of probe contacts to a larger grid of pins or other inter-connection means to the equipment used to electrically test the integrated circuit device. The fan out substrate can be made from various materials and constructions including single and multi-layer ceramic with thick or think film wiring, silicon wafer with thin film wiring, epoxy glass laminate construction with high density copper wiring. The integral rigid test probes (12) are attached to the first surface (11) of the substrate (10). The probes are used to contact the solder balls (22) on the integrated circuit device (20). The solder balls (22) are attached to the first surface (21) of the integrated circuit device (20). The geometry of the integral rigid test probe (12) is optimized to penetrate the oxides on the surface of the solder balls (22) to provide a low resistance connection.

Figure 2:
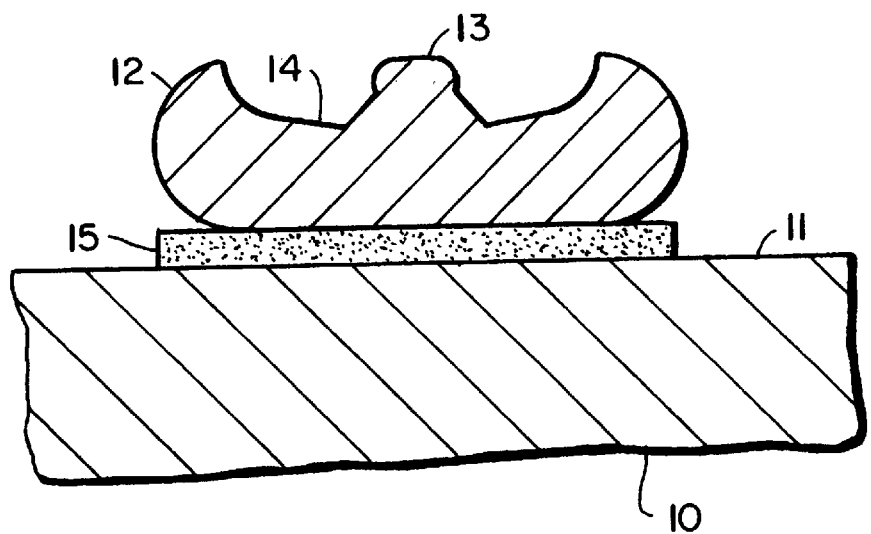
FIG. 2 shows an enlarged cross section of a single integral rigid test probe attached to the fan out wiring on the test substrate.

FIG. 2 shows an enlarged cross section of the integral rigid test probe (12). The probe geometry is optimized to limit the penetration of the solder balls on the integrated circuit device by the stud contact (13) and to contain the high temperature creep of the solder material by the cup (14) shaped structure at the base of the probe. The integral rigid test probe (12) is attached directly to the fan out wiring (15) on the first surface (11) of the substrate (10) to minimize the resistance of the probe interface.

Figure 3:
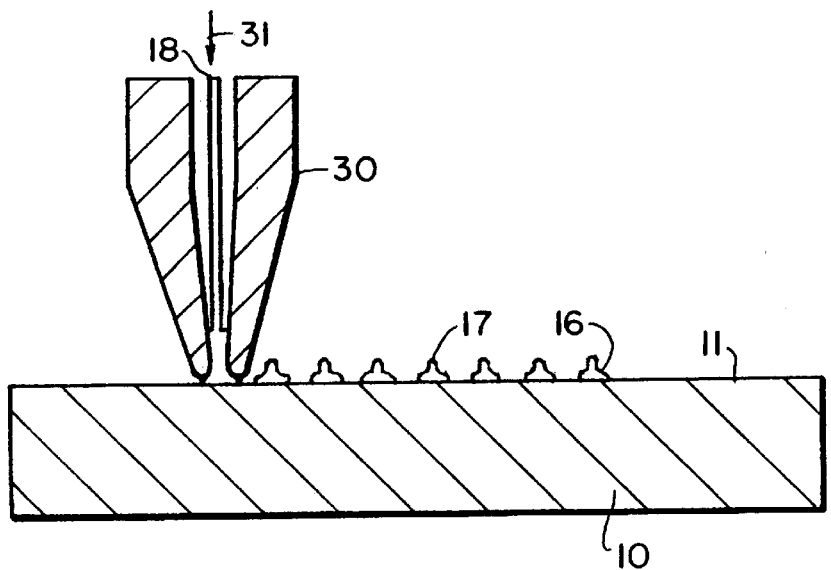
FIGS. 3–5 show the processes used to fabricate the integral rigid probe structure on a fan out wiring substrate.
Figure 4:
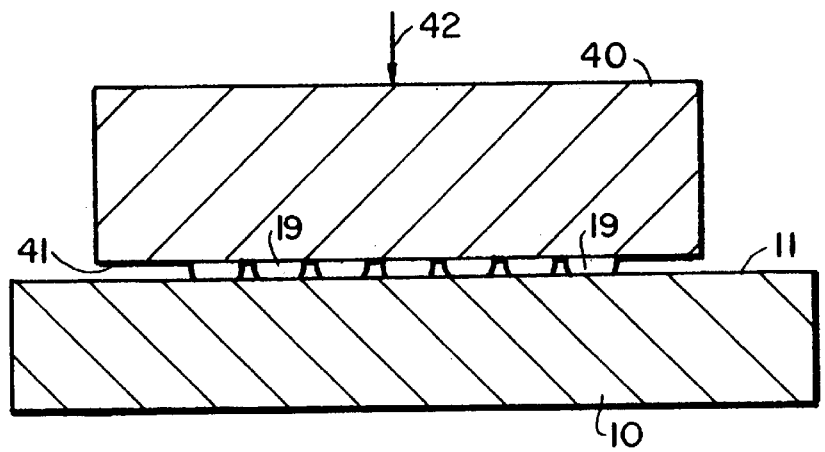

FIG. 3 shows the first process used to fabricate the integral rigid test probe. A thermosonic wire bonder tool is used to attach ball bonds (16) to the first surface (11) of the rigid substrate (10). The wire bonder tool uses a first ceramic capillary (30) to press the ball shaped end of the bond wire (18) against the first surface (11) of the substrate (10). Compression force and ultrasonic energy (31) are applied through the first capillary (30) tip and thermal energy is applied from the wire bonder stage through the substrate (10) to bond the ball shaped end of the bond wire (18) to the first surface (11) of the substrate. The bond wire (18) is cut, sheared, or broken to leave a small stud (17) protruding vertically from the ball bond (16). The studs are flattened by the polished surface (41) of a hardened anvil (40) as shown in FIG. 4. The anvil (40) is used to flatten all of the studs on the array of ball bonds to provide a level surface that is co-planar with the first surface (11) of the substrate (10). The force and displacement (42) of the anvil are controlled to achieve the desired shape of the flattened ball bond (19) and to minimize the stress transmitted to the fan out wiring and substrate (10).

Figure 5:
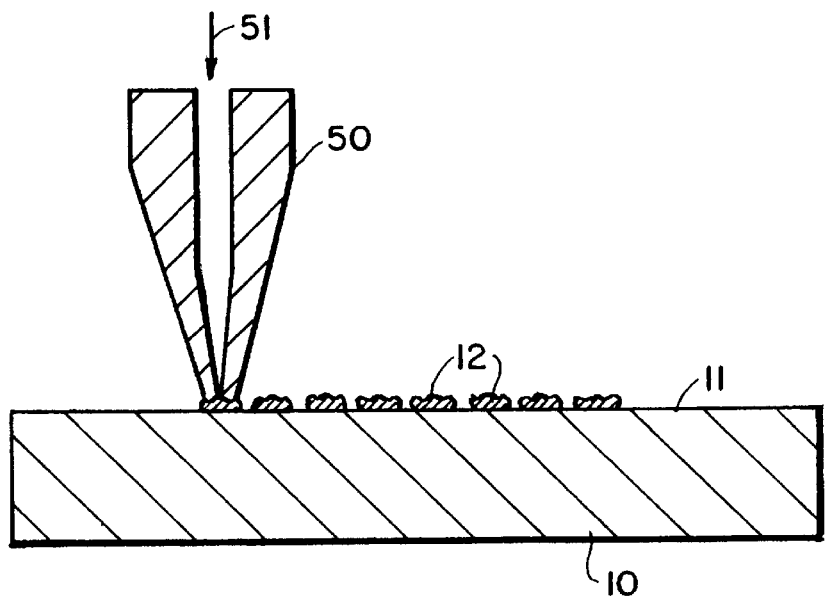

A second ceramic capillary (50) shown in FIG. 5 is used to reform the flattened ball bonds to produce the desired geometry of the integral rigid test probe (12). The tip of the second ceramic capillary (50) is designed to produce the probe geometry with the desired stud contact diameter and cup diameter. The cup diameter should be slightly larger than the diameter of the solder ball on the integrated circuit device. The height of the stud contact and the depth of the cup shaped probe geometry are determined by controlling the force and ultrasonic energy (51) used to reform the flattened ball bonds.

An individual probe contact can be reworked by removing the ball bond from the substrate using a shear blade tool and attaching a new ball bond in the reworked site. The wire stub protruding from the ball bond is flattened and reformed to complete the repair or rework process as described above

ALTERNATE EMBODIMENTS

Figure 6:
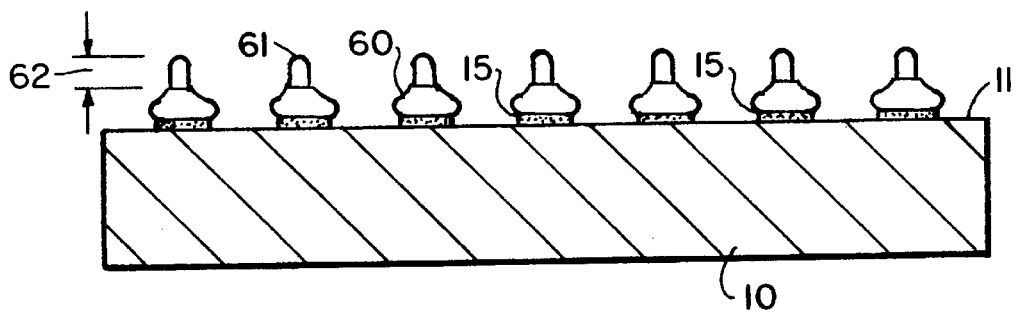
FIGS. 6–8 show alternate embodiments of the integral rigid test probe structure.
Figure 7:
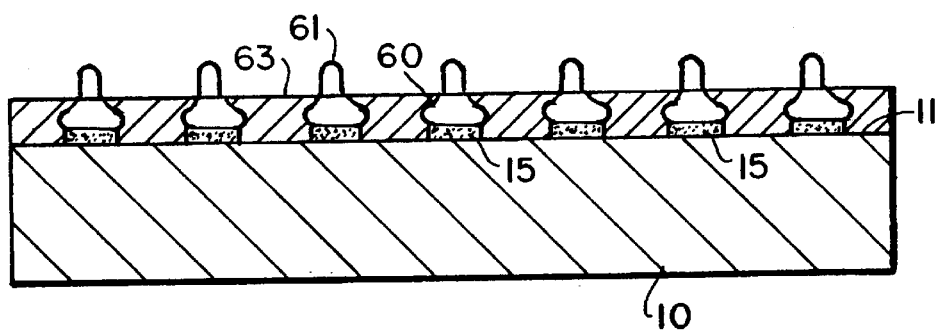
Figure 8:
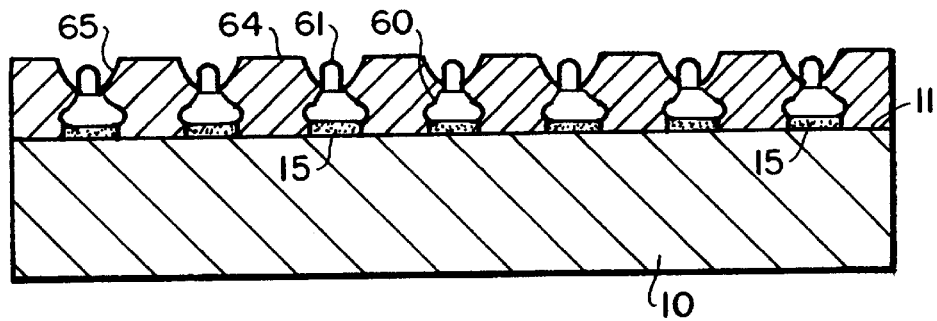

FIGS. 6, 7 and 8 show alternate embodiments of the integral rigid test probe. All of these embodiments use the wire stud (61) protruding from the ball bond (60) as the contact for the probe interface. FIG. 6 shows a cross section of an array of integral rigid test probes with the wires protruding from the ball bonds. The height (62) of the wire (61) must be controlled to provide adequate planarity of the tips of the all the wires. The height (62) of the wires (61) is typically less than or equal to 0.0003 inch from the top of the ball bonds (60).

Figure 9:
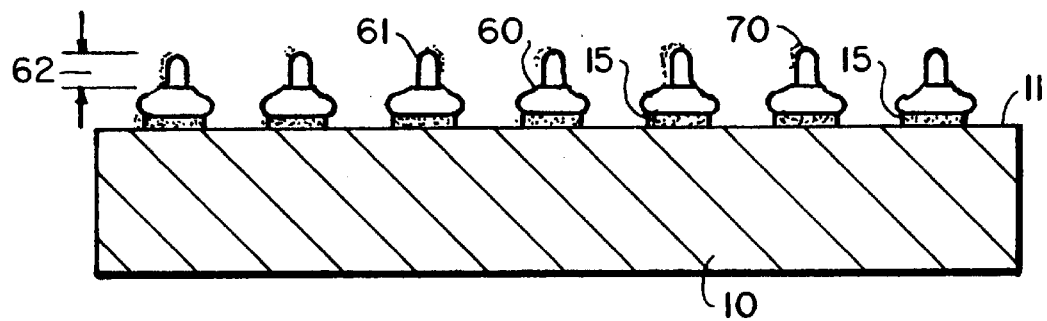
FIGS. 9–11 show the plurality of short studs is deposited with a metal layer to provide a suitable contact metallurgy and to prevent oxidation of the exposed surface.
Figure 10:
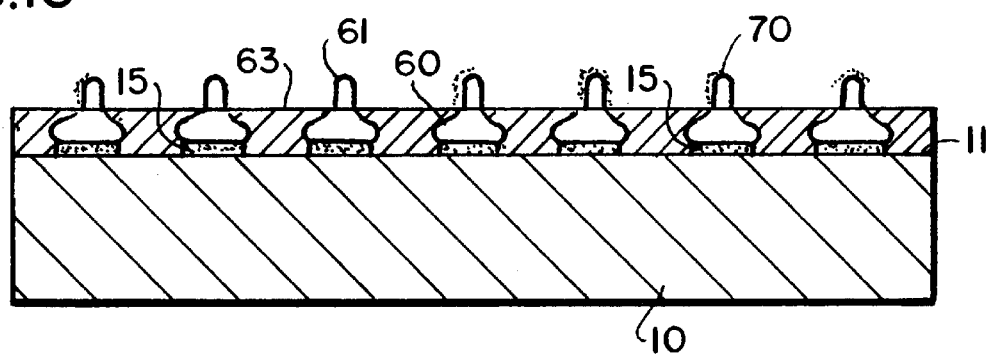
Figure 11:
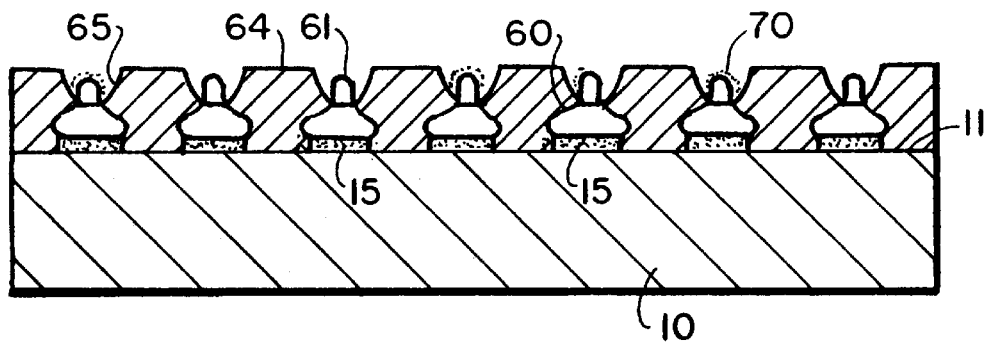

FIG. 7 shows a cross section of an array of integral rigid test probes similar to FIG. 6 with a layer of polymer material (63) added to cover the ball bonds (60). The polymer material is added to limit the penetration of the wire stud (61) into the mating solder balls on the integrated circuit device. FIG. 8 shows a similar cross section to FIGS 6 and 7 with a layer of polymer material (64) added to cover the entire wire stud (61) contact and ball bond (60) structure. The polymer material (64) is selectively removed by a laser ablation process to form a cup shaped depression (65) in the polymer material (64) surrounding each wire stud (61). The cup shaped depression (65) is used to limit the penetration of the wire stud (61) into the solder balls on the integrated circuit device and to contain the high temperature creep of the solder during testing and burn-in of the device FIGS. 9, 10 and 11 show the surface of integral rigid test probe is deposited with a metal layer (70) to provide a suitable contact metallurgy and to prevent oxidation of the interface at temperatures up to 200 C.

Figure 12:
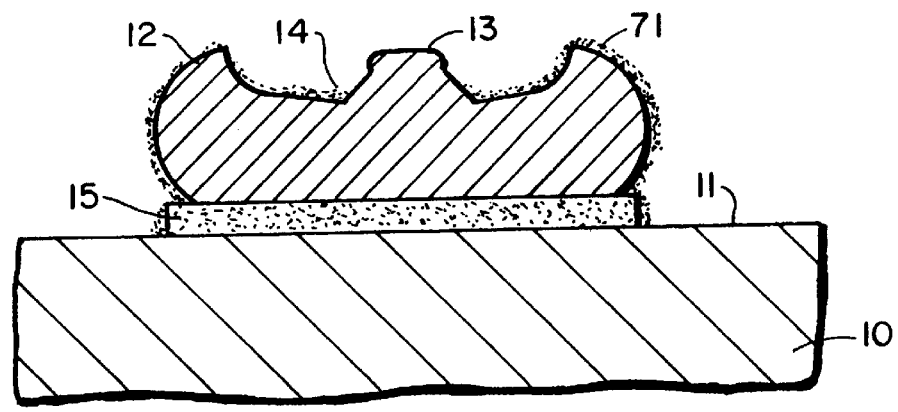
FIG. 12 shows the surface of the toroidal cupshaped contact is deposited with a metal layer to provide a suitable contact metallurgy and to prevent oxidation of the exposed surface.

FIG. 12 shows the surface of toroidal cupshaped integral rigid test probe is deposited with a metal layer (71) to provide a suitable contact metallurgy and to prevent oxidation of the interface at temperatures up to 200 C.

Figure 13:
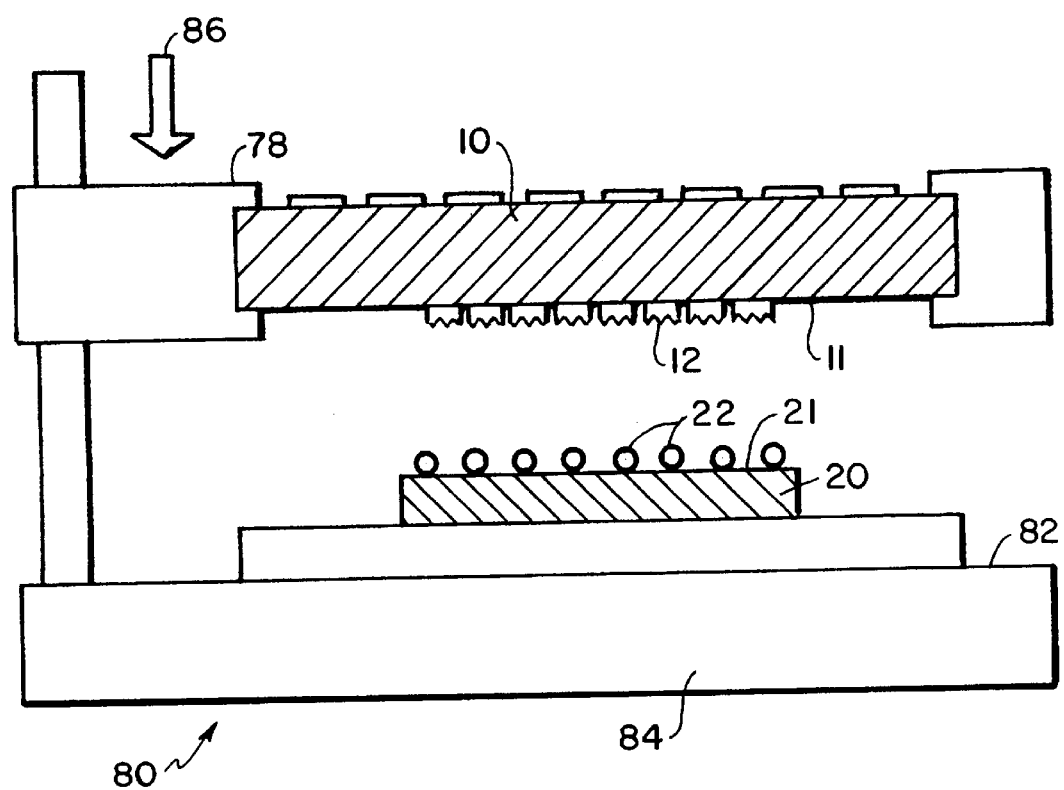
FIG. 13 shows the structure of FIG. 1 held in an apparatus for moving the probe in engagement with an electronic device.

FIG. 13 shows substrate 10 held by arm 78 of fixture 80. Work piece 20 is disposed on support 82 which is disposed in contact with fixture 80 by base 84. Arm 78 is adapted for movement as indicated by array 86 towards base 84 so that probe tips 12 are brought into engagement with conductors 22. An example of an apparatus providing a means for moving substrate 10 into engagement with work piece 20 can be found in U.S. Pat. No. 4,875,614.

While we have described our preferred embodiments of our invention, it will be understood that those skilled in art, both now and in the future, may make various improvements and enhancements which fall within the scope of the claims which follow. These claims should be constructed to maintain the proper protection for the invention first disclosed.

What is claimed is:

1. A high density probe apparatus for making electrical contact with a plurality of solder balls on an integrated circuit device, said integrated circuit device possessing high density area array solder ball connections comprising;

a first fan—out substrate having a first surface; said first surface having a plurality of contact locations; a plurality of ball bonds formed in a cup shaped geometry and surrounded by a layer of polymer material, which ball bonds are attached to said plurality of contact locations;

a plurality of short studs extending outward, away from said ball bonds; away from said first surface on said fan—out substrate;

said polymer material having a cup shaped geometry formed around said plurality of studs extending from said plurality of ball bonds.

2. A high density probe according to claim 1, wherein said plurality of ball bonds are surrounded by a layer of polymer material.

3. A high density probe according to claim 1, wherein said polymer material has a cup shaped geometry formed around each of said plurality of studs extending from said plurality of ball bonds.

4. A high density probe according to claim 1, wherein said stud and cup shaped geometry can be removed and replaced is one or more of the structures are damaged.

5. A high density probe according to claim 1 wherein said fan-out substrate is selected from the group consisting of: multilayer ceramic substrates with thick film wiring, multilayer ceramic substrates with think film wiring, metalized ceramic substrates with thin film wiring, epoxy glass laminate substrates with copper wiring, silicon substrates with thin film wiring.

6. A structure according to claim 1, wherein said structure is a high density probe for an electronic device.

7. An apparatus according to claim 1, wherein said surface of the plurality of short studs has a first metal layer deposited to provide a suitable contact metallurgy to inhibit oxidation of the surface at temperatures up to 200 C; said first metal layer includes a material selected from the group consisting of Pd, Pt, Au, Ru, W, Rh, Ir, Ni, and their alloys.

8. An apparatus according to claim 1, wherein a second layer of metal can be sued between said the surface of short studs and said first metal layer to prevent out-diffusion of the underlying material; said second metal layer includes a material selected from the group consisting of TiN, TaN, Cr, Co, Ni, Zr, ZrN, or their alloys.

9. An apparatus according to claim 1, wherein said surface of the plurality of toroidal cupshaped contacts has a first metal layer deposited to provide a suitable contact metallurgy to inhibit oxidation of the surface at temperatures up to 200 C; said first metal layer includes a material selected from the group consisting of Pd, Pt, Au, Ru, W, Rh, Ir, Ni, and their alloys.

10. An apparatus according to claim 9, wherein a second layer of metal is used between said the surface of the toroidal cupshaped contact and said first metal layer to prevent out-diffusion of the underlying material; said second metal layer includes a material selected from the group consisting of TiN, TaN, Cr, Co, Ni, Zr, ZrN, or their alloys.

* * * * *